US011901399B2

(12) United States Patent
Yen et al.

(10) Patent No.: US 11,901,399 B2
(45) Date of Patent: Feb. 13, 2024

(54) ENHANCED SENSING COIL FOR SEMICONDUCTOR DEVICE

(71) Applicant: Realtek Semiconductor Corporation, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 661 days.

(21) Appl. No.: 17/011,099

(22) Filed: Sep. 3, 2020

(65) Prior Publication Data

US 2021/0074803 A1    Mar. 11, 2021

Related U.S. Application Data

(60) Provisional application No. 62/904,750, filed on Sep. 24, 2019, provisional application No. 62/898,618, filed on Sep. 11, 2019.

(30) Foreign Application Priority Data

Jul. 23, 2020   (TW) .................................. 109125002

(51) Int. Cl.
  H01F 19/04    (2006.01)
  H01F 27/28    (2006.01)
  H01L 49/02    (2006.01)
  H01F 27/40    (2006.01)
(52) U.S. Cl.
  CPC ......... H01L 28/10 (2013.01); H01F 27/2804 (2013.01); H01F 27/40 (2013.01)
(58) Field of Classification Search
  CPC ...... H01F 27/2804; H01F 27/40; H01F 19/04; H01L 28/10

USPC .......................................................... 257/531
See application file for complete search history.

(56) References Cited

U.S. PATENT DOCUMENTS

| | | | |
|---|---|---|---|
| 2007/0268007 A1 | 11/2007 | Rai | |
| 2008/0284553 A1 | 11/2008 | Lim et al. | |
| 2009/0096413 A1* | 4/2009 | Partovi | H01F 27/2804 320/108 |
| 2013/0265132 A1* | 10/2013 | Huang | H01F 27/29 336/200 |
| 2013/0267185 A1* | 10/2013 | Chen | H04B 1/44 455/78 |

(Continued)

FOREIGN PATENT DOCUMENTS

| | | |
|---|---|---|
| CN | 102483984 A | 5/2012 |
| CN | 104717833 A | 6/2015 |

(Continued)

OTHER PUBLICATIONS

China Patent Office, "Office Action", No. 202010825074.4, dated Dec. 30, 2021.

*Primary Examiner* — Didarul A Mazumder
(74) *Attorney, Agent, or Firm* — Locke Lord LLP; Tim Tingkang Xia, Esq.

(57) ABSTRACT

A semiconductor device includes a first coil, a second coil, and a third coil. The second coil is disposed with respect to the first coil. The third coil is configured to sense a signal on the first coil. A first overlapped area, on a projection plane, of the third coil and the first coil is larger than a second overlapped area, on the projection plane, of the third coil and the second coil.

17 Claims, 8 Drawing Sheets

(56) References Cited

U.S. PATENT DOCUMENTS

| | | | |
|---|---|---|---|
| 2016/0268039 A1* | 9/2016 | Park | H05K 1/181 |
| 2016/0336914 A1 | 11/2016 | Wang et al. | |
| 2018/0254139 A1* | 9/2018 | Yazaki | H01F 27/2804 |
| 2018/0254313 A1* | 9/2018 | Huang | H01L 23/528 |
| 2018/0294089 A1* | 10/2018 | Leong | H01F 27/34 |
| 2020/0177151 A1* | 6/2020 | Pierce | H01F 27/2804 |
| 2021/0074465 A1 | 3/2021 | Yen et al. | |

FOREIGN PATENT DOCUMENTS

| | | |
|---|---|---|
| CN | 110335737 A | 10/2019 |
| CN | 112489922 A | 3/2021 |
| TW | 200535878 A | 11/2005 |
| TW | 201342402 A | 10/2013 |

\* cited by examiner

ENHANCED SENSING COIL FOR SEMICONDUCTOR DEVICE

RELATED APPLICATIONS

This application claims priority to U.S. Provisional Application Ser. No. 62/898,618 filed Sep. 11, 2019, U.S. Provisional Application Ser. No. 62/904,750 filed Sep. 24, 2019, and Taiwan Application Serial Number 109125002 filed Jul. 23, 2020, which are herein incorporated by reference.

BACKGROUND

Technical Field

The present disclosure relates to semiconductor technology. More particularly, the present disclosure relates to a semiconductor device.

Description of Related Art

With develop of semiconductor technology, inductors/transformers are used in various electrical apparatuses. For example, number values of turns of two coils of one transformer may be different. The number values of turns are key factors for signal coupling.

SUMMARY

One embodiment of the present disclosure is related to a semiconductor device. The semiconductor device includes a first coil, a second coil, and a third coil. The second coil is disposed with respect to the first coil. The third coil is configured to sense a signal on the first coil. A first overlapped area, on a projection plane, of the third coil and the first coil is larger than a second overlapped area, on the projection plane, of the third coil and the second coil.

One embodiment of the present disclosure is related to a semiconductor device. The semiconductor device includes a first coil, a second coil, and a third coil. The second coil is disposed with respect to the first coil. The third coil is configured to sense a signal on the first coil. A first capacitor value between the third coil and the first coil is larger than a second capacitor value between the third coil and the second coil.

As shown in the above embodiments, in the semiconductor device of the present disclosure, the overlapped area of the sensing coil (for example, the third coil) and one coil (for example, the first coil) is larger. Therefore, coupling between the sensing coil (for example, the third coil) and this coil (for example, the first coil) can be enhanced in a situation that another second coil (for example, the second coil) is less affected.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
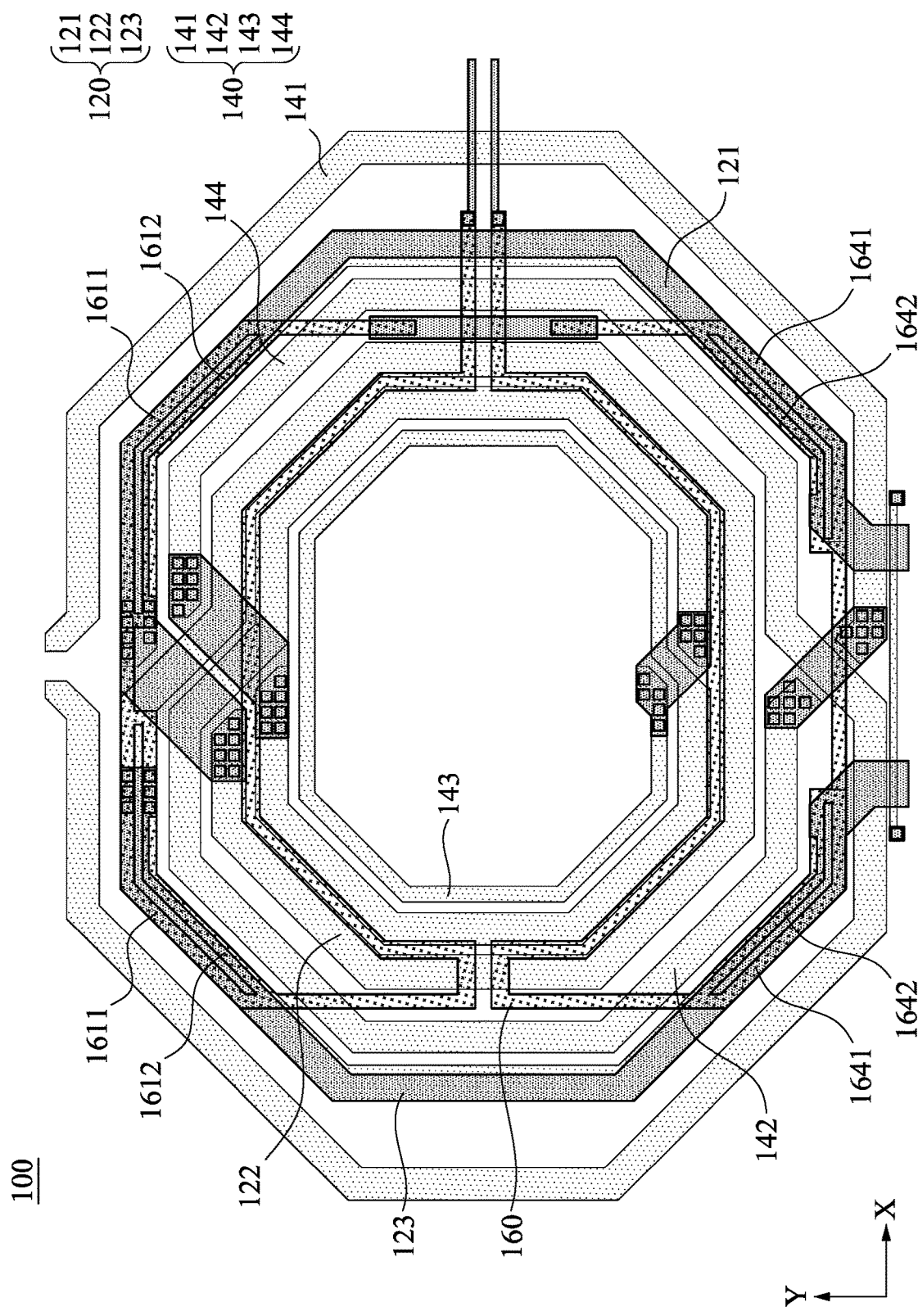
FIG. 1 is a schematic diagram illustrating a semiconductor device according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure. In addition, the drawings are for illustrative purposes only, and are not drawn according to the original dimensions. For ease of understanding, the same elements or similar elements in the following description will be described with the same symbols.

Reference is made to FIG. 1. FIG. 1 is a schematic diagram illustrating a semiconductor device 100 according to some embodiments of the present disclosure. As illustrated in FIG. 1, the semiconductor device 100 includes a first coil 120, a second coil 140, and the third coil 160. The second coil 140 is disposed with respect to the first coil 120. The third coil 160 is disposed below the first coil 120 and the second coil 140.

In some embodiments, the first coil 120 and the second coil 140 work together as a transformer. In some embodiments, the first coil 120 and the second coil 140 work as two inductors.

In some embodiments, a number value of turns of the first coil 120 is different from a number value of turns of the second coil 140. For example, the number value of turns of the first coil 120 is smaller than the number value of turns of the second coil 140. As illustrated in FIG. 1, the first coil 120 includes a first trace 121, a second trace 122, and a third trace 123. The second coil 140 includes a first trace 141, a second trace 142, a third coil 143, and a fourth coil 144.

Figure 2:
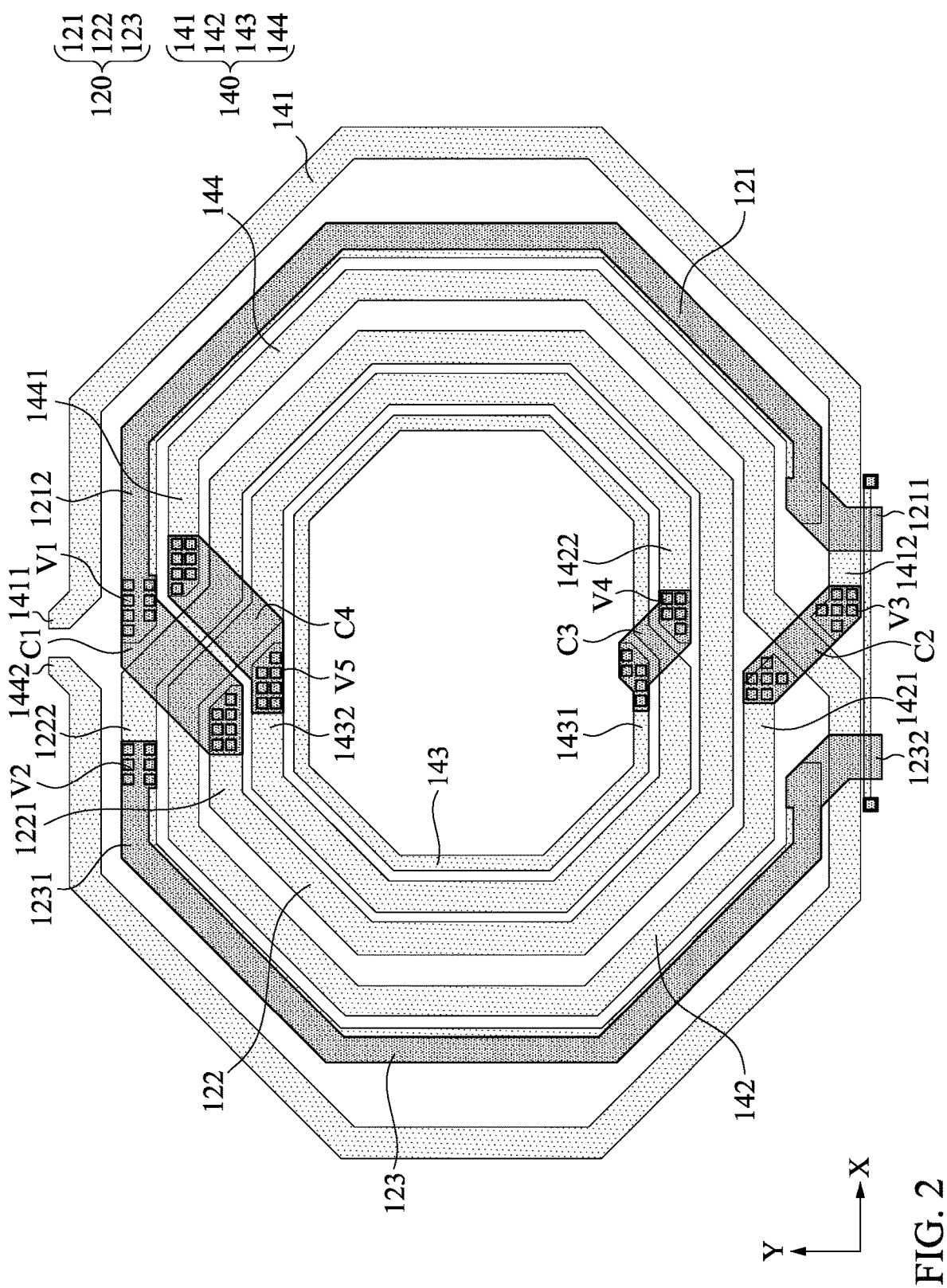
FIG. 2 is a schematic diagram illustrating two coils in FIG. 1 according to some embodiments of the present disclosure.

Reference is made to FIG. 2. FIG. 2 is a schematic diagram illustrating the first coil 120 and the second coil 140 in FIG. 1 according to some embodiments of the present disclosure.

As illustrated in FIG. 2, a first terminal 1211 of the first trace 121 may be a signal input/output terminal. A second terminal 1212 of the first trace 121 is coupled to a first terminal 1221 of the second trace 122 by a connection component C1 and connection vias V1. A second terminal 1222 of the second trace 122 is coupled to a first terminal 1231 of the third trace 123 by connection vias V2. A second terminal 1232 of the third trace 123 may be a signal input/output terminal.

A first terminal 1411 of the first trace 141 may be a signal input/output terminal. A second terminal 1412 of the first trace 141 is coupled to a first terminal 1421 of the second trace 142 by a connection component C2 and connection vias V3. A second terminal 1422 of the second trace 142 is coupled to a first terminal 1431 of the third trace 143 by a connection component C3 and connection vias V4. A second terminal 1432 of the third trace 143 is coupled to a first terminal 1441 of the fourth trace 144 by a connection component C4 and connection vias V5. A second terminal 1442 of the fourth trace 144 may be a signal input/output terminal.

The configurations of the first coil 120 and the second coil 140 are merely for illustration, and various configurations are within the contemplated scopes of the present disclosure.

Figure 3:
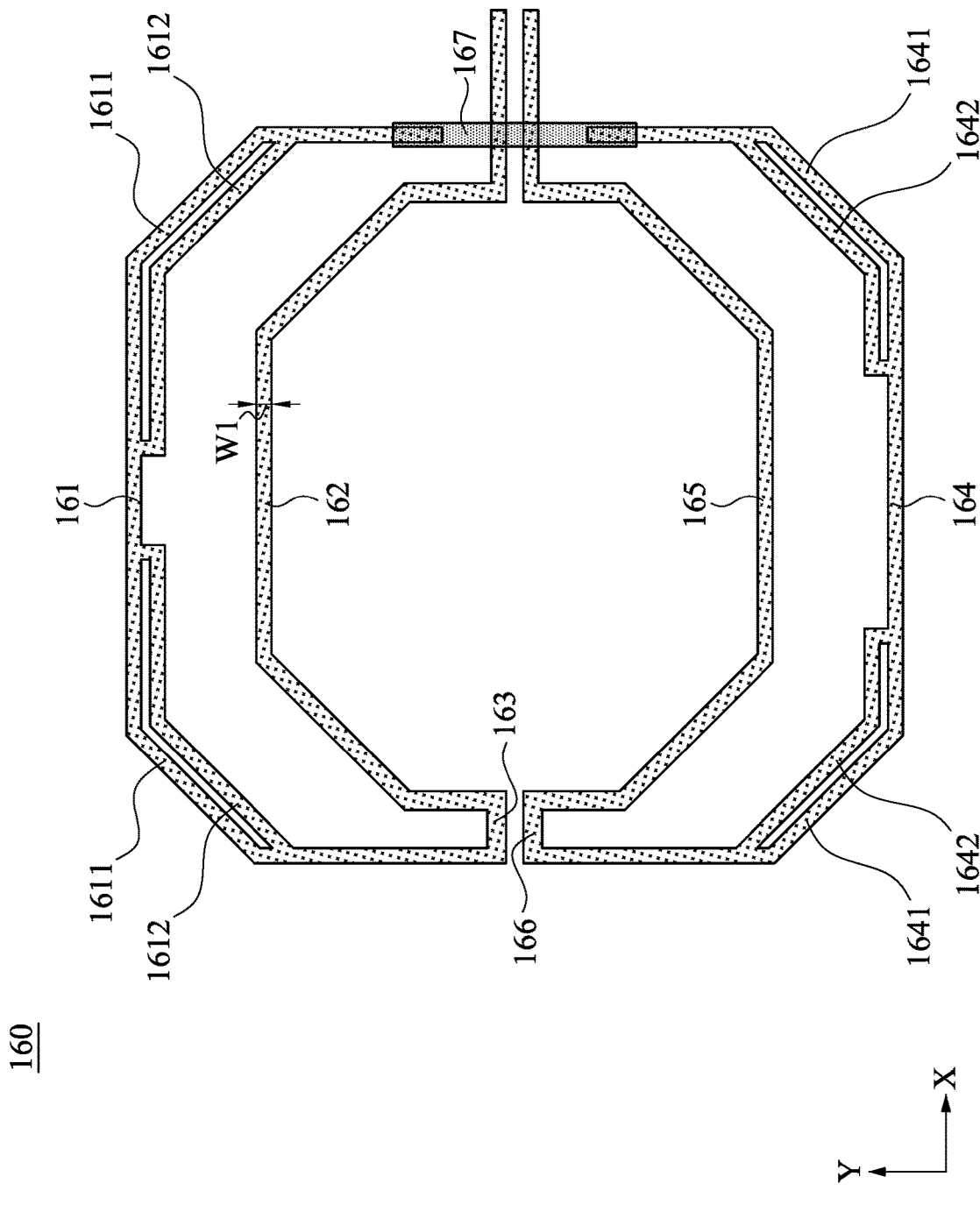
FIG. 3 is a schematic diagram illustrating one coil in FIG. 1 according to some embodiments of the present disclosure.
Figure 4:
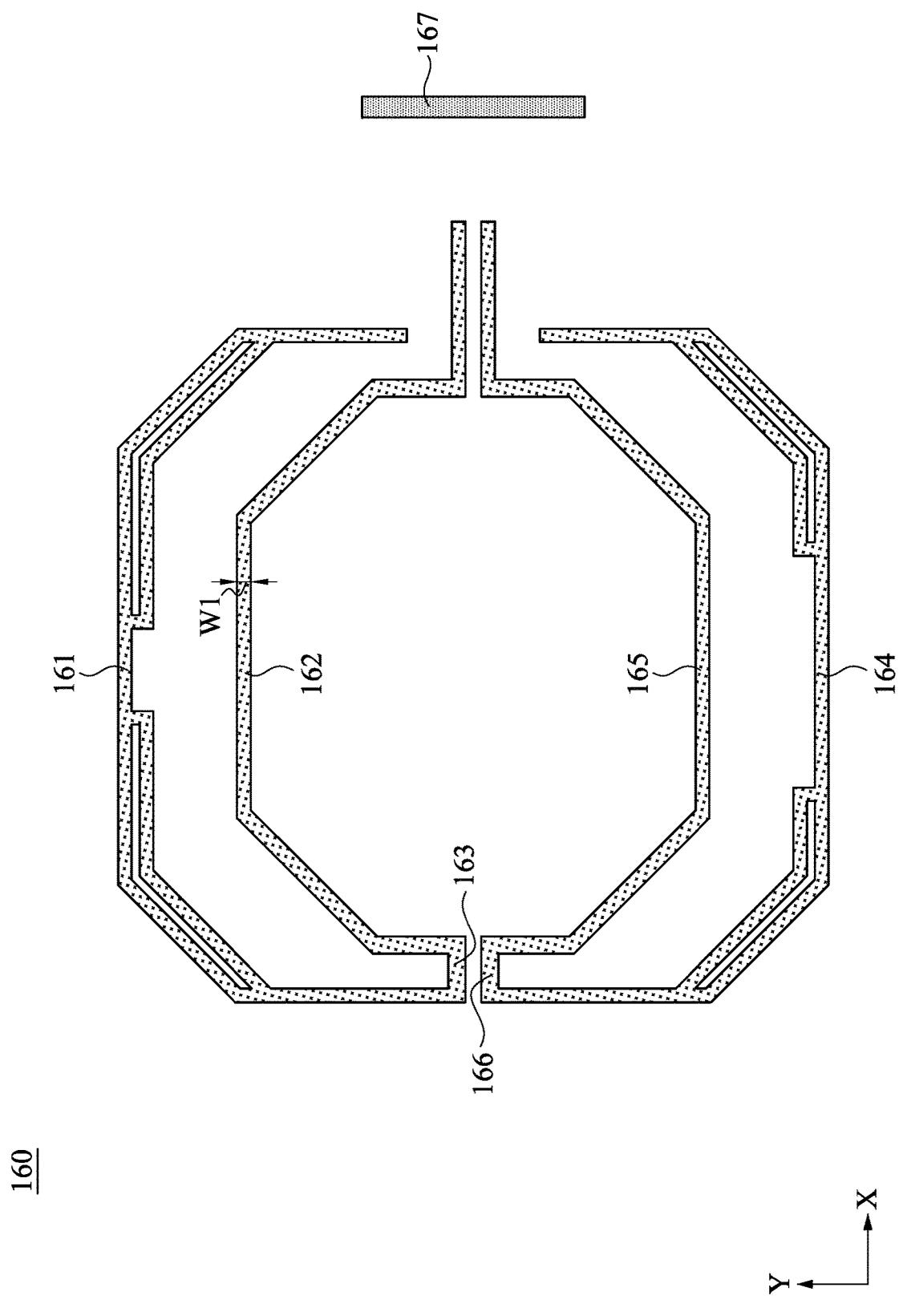
FIG. 4 is an explode diagram illustrating the coil in FIG. 3 according to some embodiments of the present disclosure.

References are made to FIG. 3 and FIG. 4. FIG. 3 is a schematic diagram illustrating the third coil 160 in FIG. 1 according to some embodiments of the present disclosure. FIG. 4 is an explode diagram illustrating the third coil 160 in FIG. 3 according to some embodiments of the present disclosure. The third coil 160 can operate as a sensing coil, to sense (couple) a signal on the first coil 120 or on the second coil 140.

As illustrated in FIG. 3, the third coil 160 includes a first trace 161, a second trace 162, a third trace 163, a fourth trace 164, a fifth trace 165, a sixth trace 166, and the seventh trace 167. The third trace 163 is coupled between the first trace 161 and the second trace 162. The sixth trace 166 is coupled between the fourth trace 164 and the fifth trace 165. The seventh trace 167 is coupled to the first trace 161 and the fourth trace 164.

In some embodiments, the first trace 161, the second trace 162, the third trace 163, the fourth trace 164, the fifth trace 165, the sixth trace 166 are disposed at a metal layer (for example, M6 metal layer). The seventh trace 167 is disposed at another metal layer (for example, M5 metal layer).

In some embodiments, each of the first trace 161, the second trace 162, the third trace 163, the fourth trace 164, the fifth trace 165, and the sixth trace 166 has a multi-layer structure. In other words, each of the first trace 161, the second trace 162, the third trace 163, the fourth trace 164, the fifth trace 165, and the sixth trace 166 is formed by multiple stacked metal layers. In some embodiments, each of the first trace 161, the second trace 162, the third trace 163, the fourth trace 164, the fifth trace 165, and the sixth trace 166 has a single-layer structure.

In some embodiments, the second trace 162, the third trace 163, the fifth trace 165, and the sixth trace 166 have a line width W1. In some embodiments, the first trace 161 includes a first sub-trace 1611 and a second sub-trace 1612. The fourth trace 164 includes a first sub-trace 1641 and a second sub-trace 1642. In some embodiments, the first sub-trace 1611, the second sub-trace 1612, the first sub-trace 1641, and the second sub-trace 1642 have the line width W1.

In some embodiments, the first sub-trace 1611, the second sub-trace 1612, the first sub-trace 1641, and the second sub-trace 1642 of the third coil 160 are disposed with respect to the first coil 120. For example, reference is made to FIG. 1 again. The first sub-trace 1611 and the second sub-trace 1612 of the first trace 161 of the third coil 160 are disposed below the first trace 121 or the third trace 123 of the first coil 120. The first sub-trace 1641 and the second sub-trace 1642 of the fourth trace 164 of the third coil 160 are disposed below the first trace 121 or the third trace 123 of the first coil 120. In this situation, an overlapped area, on a projection plane (a plane formed by a direction X and a direction Y), of third coil 160 and the first coil 120 is larger than an overlapped area, on the projection plane, of the third coil 160 and the second coil 140. Effectively, a capacitor value between the third coil 160 and the first coil 120 is larger than a capacitor value between the third coil 160 and the second coil 140.

As described above, the third coil 160 may be configured to sense (couple) the signal on the first coil 120 or the second coil 140. In some related approaches, if a general sensing coil is used, coupling between the sensing coil and a coil with a large number value of turns is larger, and coupling between the sensing coil and a coil with a small number value of turns is smaller.

Compared to these related approaches above, in the present disclosure, the overlapped area of the third coil 160 and the first coil 120 (number value of turns is smaller) is larger, and thus coupling between the third coil 160 and the first coil 120 (number value of turns is smaller) can be enhanced in a situation that the second coil 140 is less affected. Accordingly, the semiconductor device 100 of the present disclosure can be applied to some specific applications.

As illustrated in FIG. 1, the overlapped area of the third coil 160 and the first coil 120 includes a plurality of overlapped areas. In some embodiments, a ratio of the overlapped area of the third coil 160 and the first coil 120 to the overlapped area of the third coil 160 and the second coil 140 is larger than or equal to 1.5, but the present disclosure is not limited thereto. In some embodiments, when the third coil 160 and the second coil 140 are not overlapped, the overlapped area of the third coil 160 and the first coil 120 is larger than a predetermined area. The predetermined area is, for example, $10 \mu m^2$, but the present disclosure is not limited thereto.

In some embodiments, there is no gap between the first sub-trace 1611 of the first trace 161 and the second sub-trace 1612 of the first trace 161. In other words, the first sub-trace 1611 and the second sub-trace 1612 are integrated to be a signal component. Similarly, in some embodiments, there is no gap between the first sub-trace 1641 of the fourth trace 164 and the second sub-trace 1642 of the fourth trace 164. In other words, the first sub-trace 1641 and the second sub-trace 1642 are integrated to be a signal component.

Figure 5:
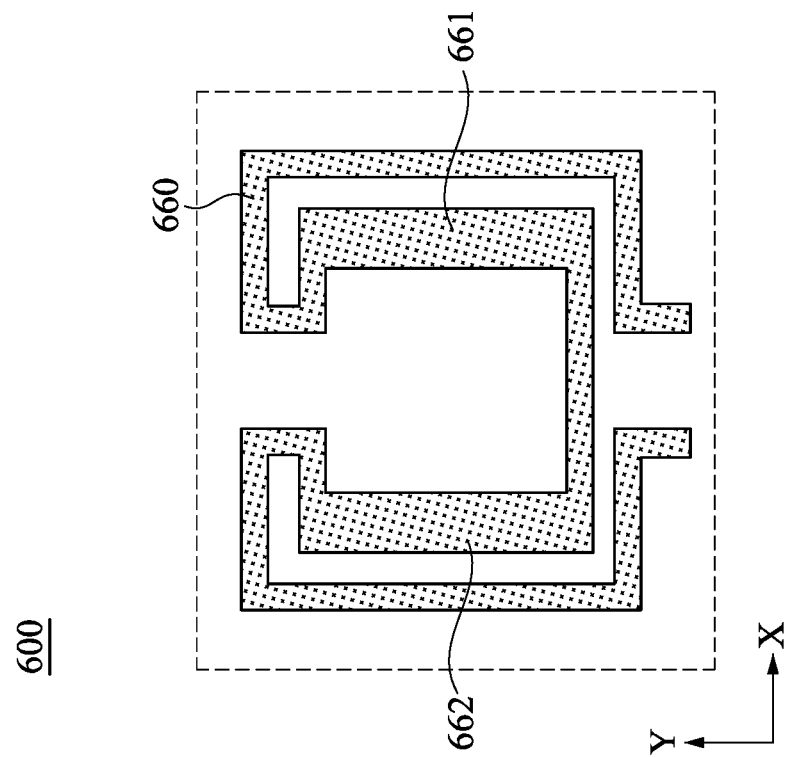
FIG. 5 is a schematic diagram illustrating a semiconductor device according to some embodiments of the present disclosure.

Reference is made to FIG. 5. FIG. 5 is a schematic diagram illustrating a semiconductor device 500 according to some embodiments of the present disclosure. For making the figures to be simple and ease of understanding, only a third coil 560 is illustrated in FIG. 5. A first coil and a second coil configured to operate as two inductors or as a transformer are omitted. As described above, there is no gap between the first sub-trace 1611 and the second sub-trace 1612 in FIG. 3, to form a first trace 561 in FIG. 5. There is no gap between the first sub-trace 1641 and the second sub-trace 1642 in FIG. 3, to form a second trace 562 in FIG. 5. As illustrated in FIG. 5, the first trace 561 of the third coil 560 and the second trace 562 of the third coil 560 are disposed at an outer portion of the third coil 560. The first trace 561 and the second trace 562 have a first line width, other traces of the third coil 560 have a second line width, and the first line width is greater than the second line width.

Figure 6:
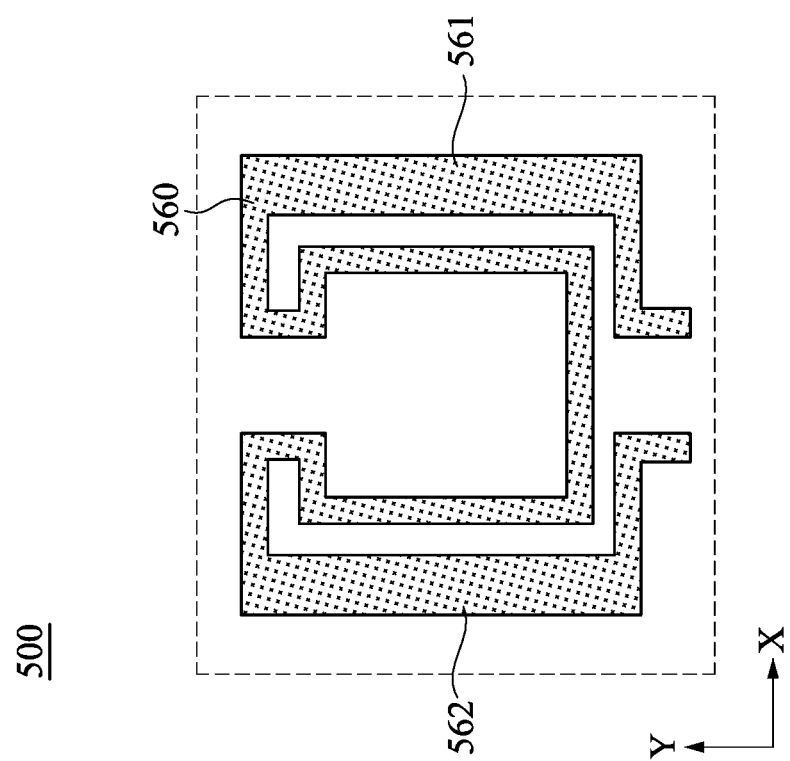
FIG. 6 is a schematic diagram illustrating a semiconductor device according to some embodiments of the present disclosure.

Reference is made to FIG. 6. FIG. 6 is a schematic diagram illustrating a semiconductor device 600 according to some embodiments of the present disclosure. For making the figures to be simple and ease of understanding, only a third coil 660 is illustrated in FIG. 6. A first coil and a second coil configured to operate as two inductors or as a transformer are omitted. A main difference between the semiconductor device 600 in FIG. 6 and the semiconductor device 500 in FIG. 5 is that, in the semiconductor device 600 in FIG. 6, a wider first trace 611 and a wider second trace 612 of the third coil 660 are disposed at an inner portion of the third coil 660.

Figure 7:
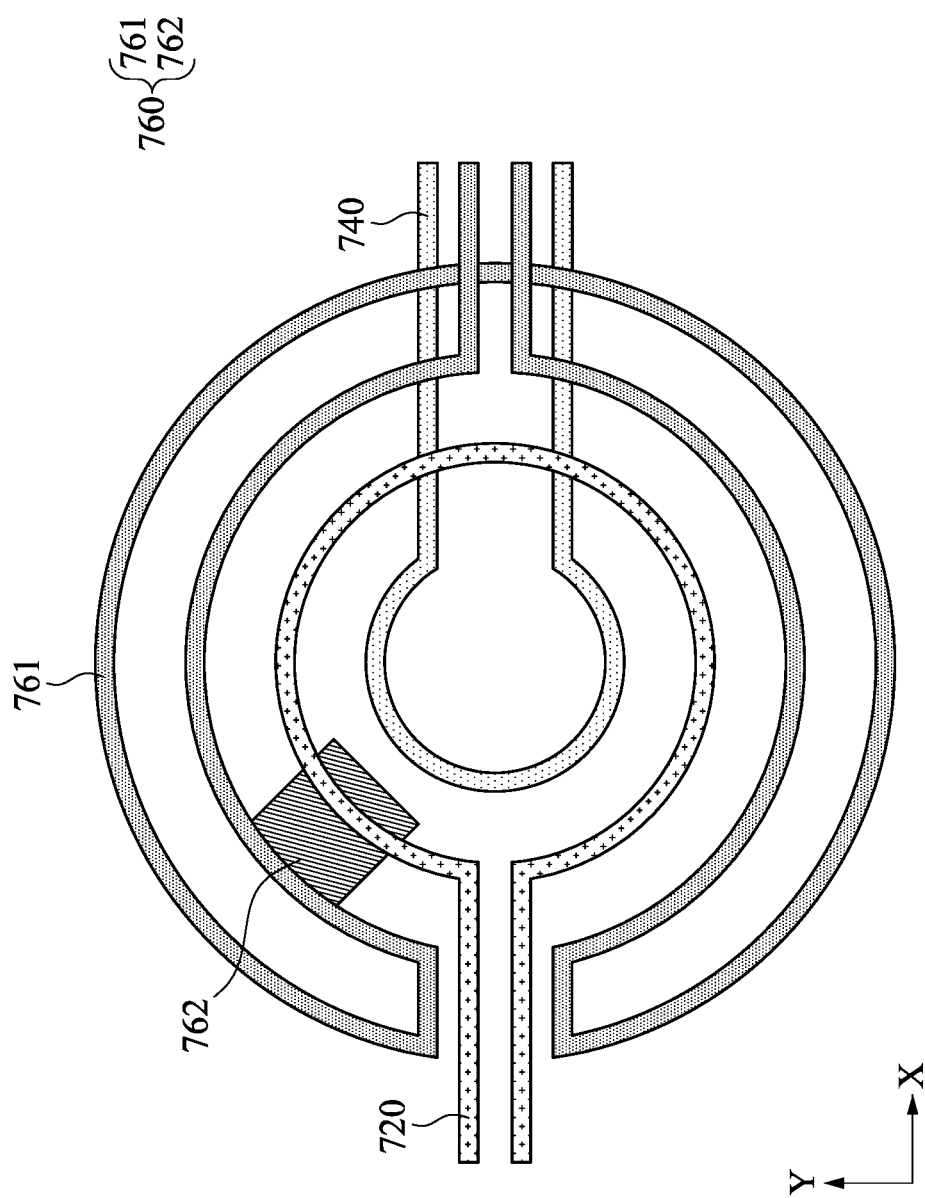
FIG. 7 is a schematic diagram illustrating a semiconductor device according to some embodiments of the present disclosure.

Reference is made to FIG. 7. FIG. 7 is a schematic diagram illustrating a semiconductor device 700 according to some embodiments of the present disclosure. As illustrated in FIG. 7, the semiconductor device 700 includes a first coil 720, a second coil 740, and a third coil 760. In some embodiments, the first coil 720 and the second coil 740 work together as a transformer. In some embodiments, the first coil 720 and the second coil 740 work as two inductors.

In the semiconductor device 700, the third coil 760 surrounds the first coil 720 and the second coil 740. In other words, the third coil 760 is disposed outside the first coil 720 and the second coil 740.

For making the figures to be simple and ease of understanding, each of the first coil 720 and the second coil 740 is illustrated as a single turn. In practice, in this example, each of the first coil 720 and the second coil 740 has multiple turns, and a number value of turns of the first coil 720 is smaller than a number value of turns of the second coil 740.

In some embodiments, the third coil 760 includes a main trace 761 and a protrusion portion 762. The protrusion portion 762 is connected to the main trace 761 by connection vias. The protrusion portion 762 and the first coil 720 (number value of turns is smaller) are overlapped on the projection plane (the plane formed by the direction X and the direction Y), to enhance coupling between the third coil 760 and the first coil 720 (number value of turns is smaller).

In the embodiments above, the third coil 760 is disposed below the first coil 720, and the main trace 761 of the third coil 760 is disposed at an outer side of the first coil 720 and the second coil 740, but the present disclosure is not limited thereto. In some embodiments, the third coil 760 may be disposed at other sides of the first coil 720 and the second coil 740.

Figure 8A:
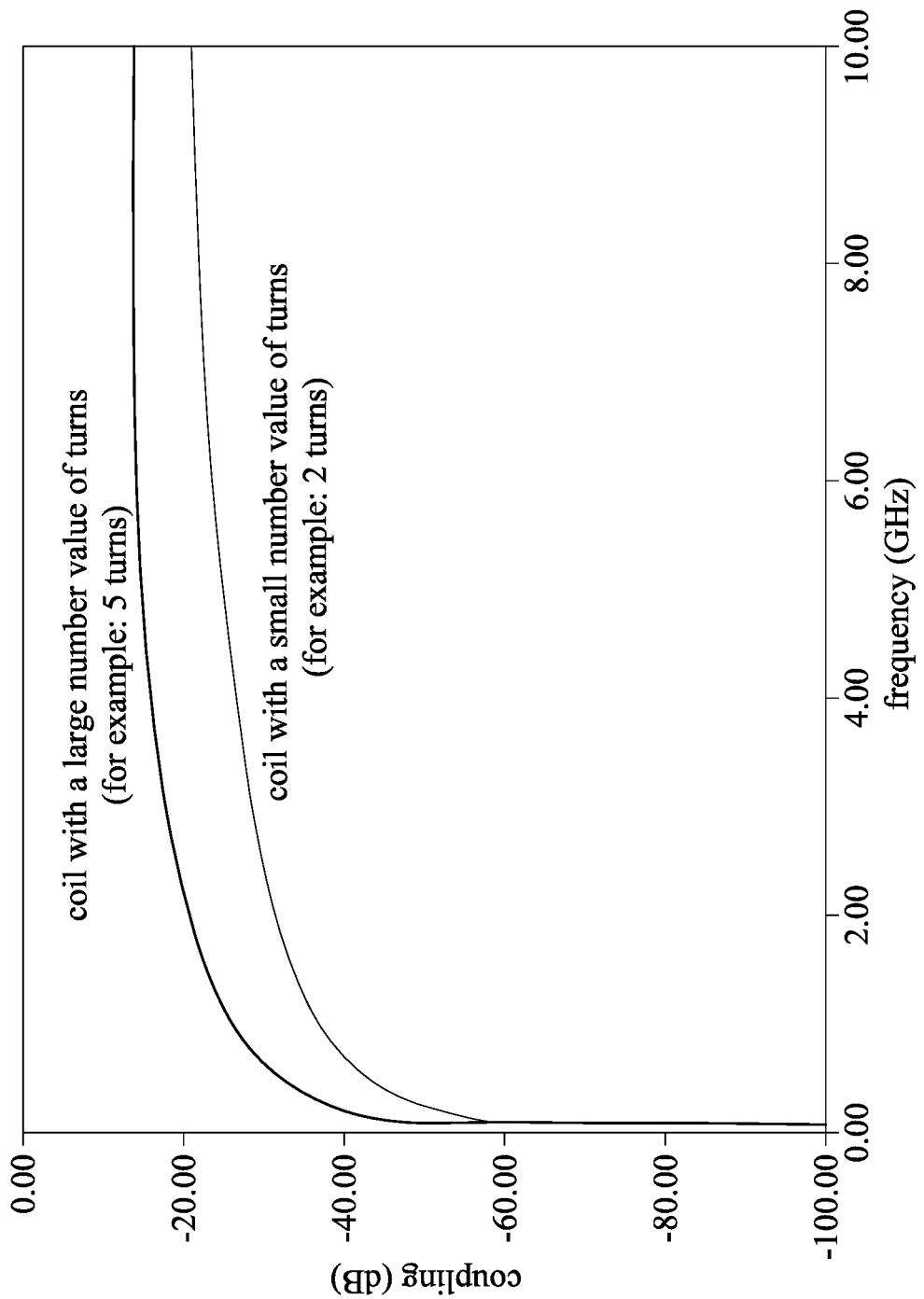
FIG. 8A is a schematic diagram illustrating relationships between signal intensity and frequencies in some related approaches.

Reference is made to FIG. 8A. FIG. 8A is a schematic diagram illustrating relationships between signal intensity and frequencies in some related approaches. As described above, in some related approaches, if a general sensing coil is used, coupling between the sensing coil and the coil with a large number value of turns is larger, and coupling between the sensing coil and the coil with a small number value of turns is smaller.

Figure 8B:
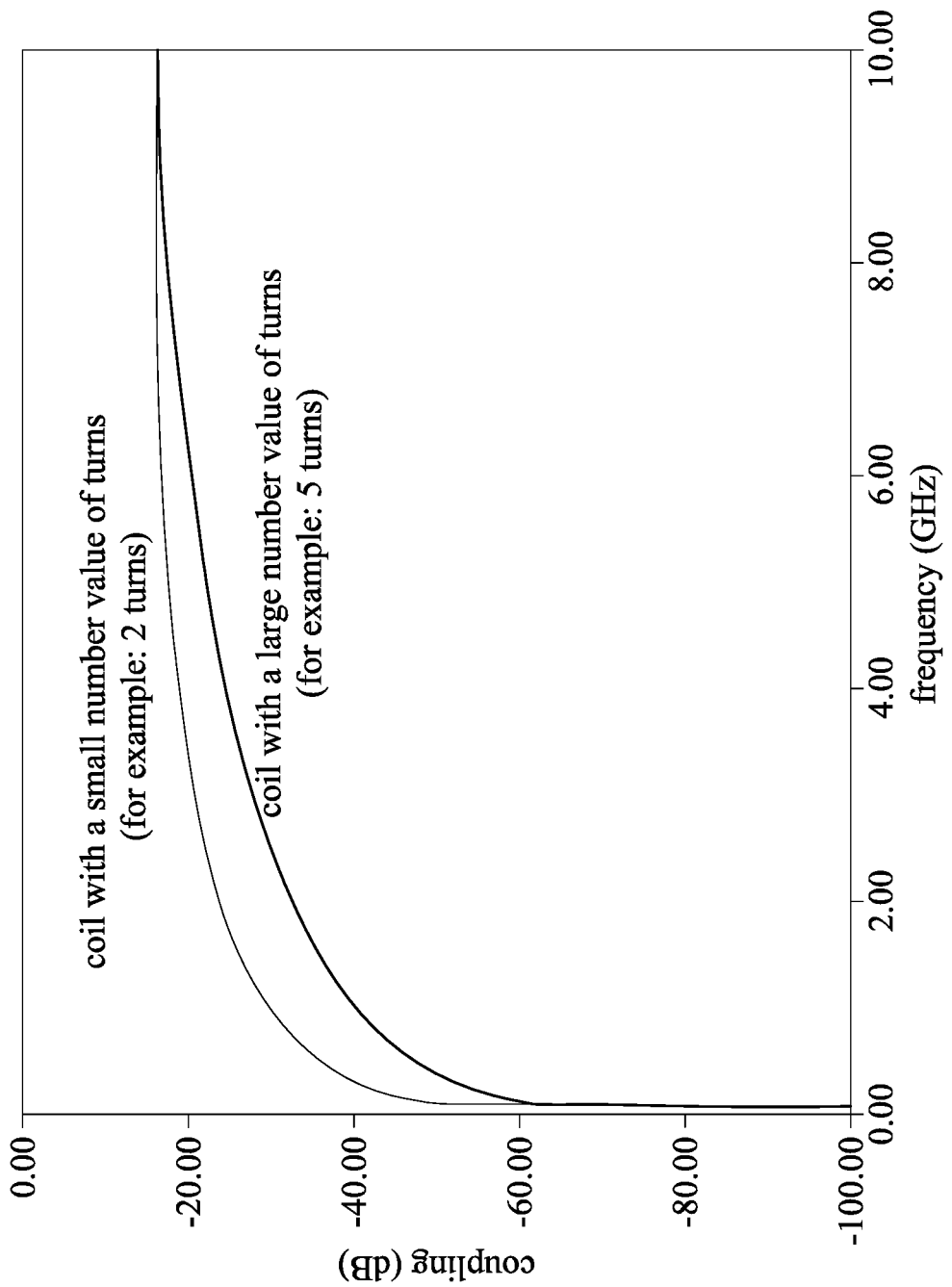
FIG. 8B is a schematic diagram illustrating relationships between signal intensity and frequencies according to some embodiments of the present disclosure.

Reference is made to FIG. 8B. FIG. 8B is a schematic diagram illustrating relationships between signal intensity and frequencies according to some embodiments of the present disclosure. Compared to the related approaches above, in the present disclosure, the overlapped area of the sensing coil (for example, the third coil) and the coil (for example, the first coil) with the small number value of turns is larger. Thus, coupling (signal intensity) between the sensing coil (for example, the third coil) and this coil (for example, the first coil) can be enhanced in a situation that another second coil (for example, the second coil) is less affected, such that the coil with the small number value of turns is with better coupling effects.

As shown in the above embodiments, in the semiconductor device of the present disclosure, the overlapped area of the sensing coil (for example, the third coil) and one coil (for example, the first coil) is larger. Therefore, coupling between the sensing coil (for example, the third coil) and this coil (for example, the first coil) can be enhanced in a situation that another second coil (for example, the second coil) is less affected.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
   a first coil;
   a second coil disposed with respect to the first coil; and
   a third coil configured to sense a signal on the first coil, wherein a first overlapped area, on a projection plane, of the third coil and the first coil is larger than a second overlapped area, on the projection plane, of the third coil and the second coil, wherein the third coil comprises:
   a first trace;
   a second trace;
   a third trace coupled between the first trace and the second trace;
   a fourth trace;
   a fifth trace;
   a sixth trace coupled between the fourth trace and the fifth trace; and
   a seventh trace coupled the first trace and the fourth trace, wherein the first trace, the second trace, the third trace, the fourth trace, the fifth trace, and the sixth trace are disposed at a first metal layer, wherein the seventh trace is disposed at a second metal layer.

2. The semiconductor device of claim 1, wherein a number value of turns of the first coil is different from a number value of turns of the second coil.

3. The semiconductor device of claim 2, wherein the number value of turns of the first coil is smaller than the number value of turns of the second coil.

4. The semiconductor device of claim 3, wherein a ratio of the first overlapped area to the second overlapped area is larger than or equal to 1.5.

5. The semiconductor device of claim 1, wherein the first overlapped area is larger than a predetermined area.

6. The semiconductor device of claim 5, wherein the predetermined area is substantially equal to 10 $\mu m^2$.

7. The semiconductor device of claim 1, wherein the second trace, the third trace, the fifth trace, and the sixth trace have a line width, wherein each of the first trace and the fourth trace comprises a first sub-trace and a second sub-trace, and the first sub-trace and the second sub-trace have the line width, wherein the first sub-trace and the second sub-trace are overlapped with the first coil on the projection plane.

8. The semiconductor device of claim 1, wherein the first trace, the second trace, the third trace, the fourth trace, the fifth trace, and the sixth trace have a multi-layer structure.

9. The semiconductor device of claim 1, wherein a first portion of the third coil have a first line width, a second portion of the third coil have a second line width, and the first line width is larger than the second line width.

10. The semiconductor device of claim 1, wherein the third coil surrounds the first coil and the second coil.

11. The semiconductor device of claim 10, wherein the first overlapped area corresponds to a plurality of overlapped areas.

12. The semiconductor device of claim 1, wherein the first overlapped area corresponds to a plurality of overlapped areas.

13. A semiconductor device, comprising:
   a first coil;
   a second coil disposed with respect to the first coil; and
   a third coil configured to sense a signal on the first coil, wherein a first capacitor value between the third coil and the first coil is larger than a second capacitor value between the third coil and the second coil,
   wherein the third coil surrounds the first coil and the second coil;
   wherein the third coil comprises a main trace and a protrusion portion, the protrusion portion is connected to the main trace, and the protrusion portion and the first coil are overlapped on a projection plane.

14. The semiconductor device of claim 13, wherein a number value of turns of the first coil is different from a number value of turns of the second coil.

15. The semiconductor device of claim 14, wherein the number value of turns of the first coil is smaller than the number value of turns of the second coil.

16. The semiconductor device of claim 13, wherein the main trace surrounds the first coil and the second coil.

17. The semiconductor device of claim 13, wherein a first portion of traces of the third coil have a first line width, a second portion of traces of the third coil have a second line width, and the first line width is larger than the second line width.

* * * * *